Figure 1:
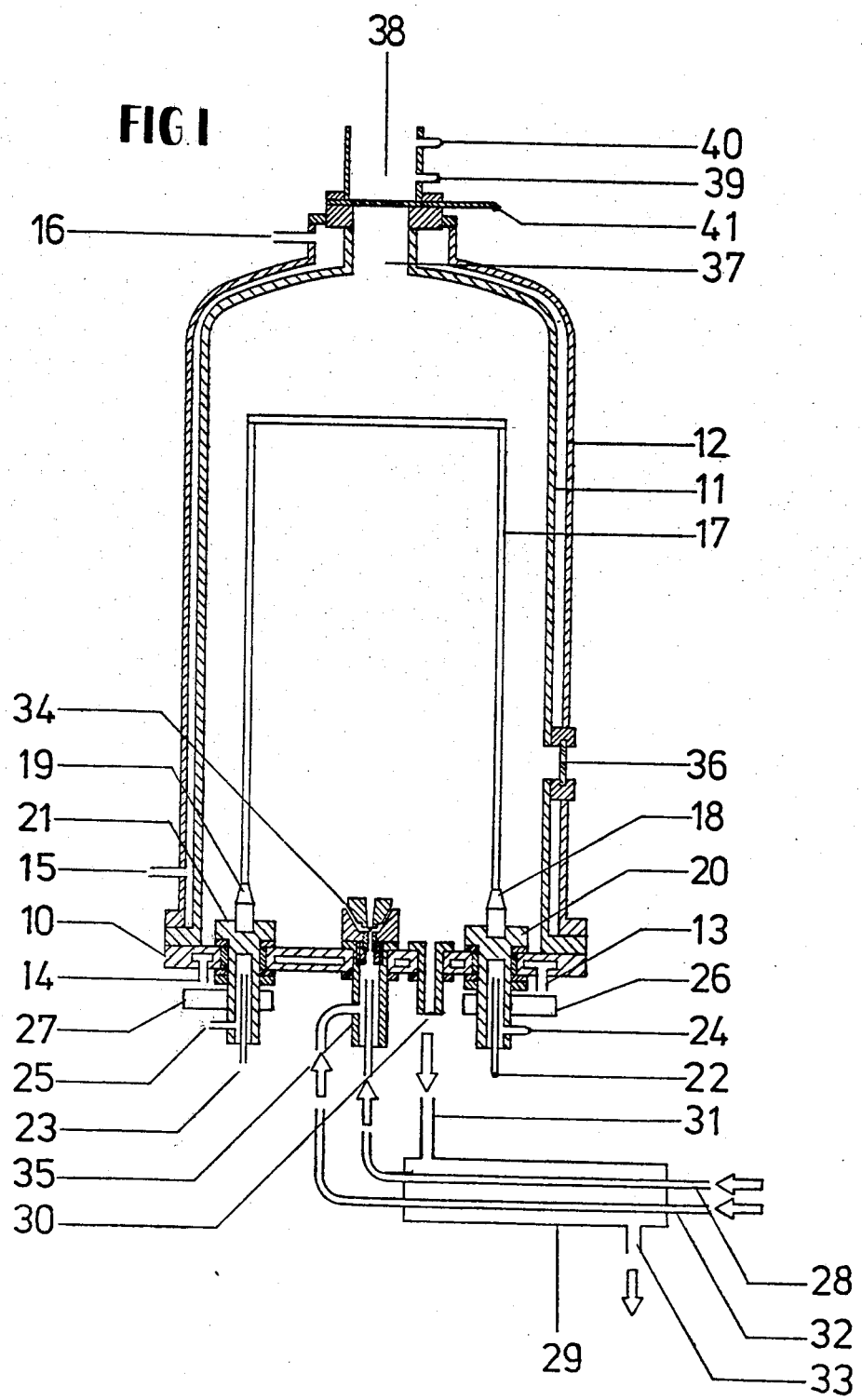

United States Patent [19]

Bugl et al.

[11] 4,311,545

[45] Jan. 19, 1982

[54] METHOD FOR THE DEPOSITION OF PURE SEMICONDUCTOR MATERIAL

[75] Inventors: Erwin Bugl, St. Radegund, Austria; Rudolf Griesshammer, Burghausen, Fed. Rep. of Germany; Helmut Lorenz, Burghausen, Fed. Rep. of Germany; Helmut Hamster, Burghausen, Fed. Rep. of Germany; Franz Köppl, Altötting, Fed. Rep. of Germany

[73] Assignee: Wacker-Chemitronic Gesellschaft für Elektronik-Grundstoffe mbH, Burghausen, Fed. Rep. of Germany

[21] Appl. No.: 126,768

[22] Filed: Mar. 3, 1980

[30] Foreign Application Priority Data

Mar. 30, 1979 [DE] Fed. Rep. of Germany ....... 2912661

[51] Int. Cl.³ .................. C30B 25/08; C30B 25/14
[52] U.S. Cl. .................. 156/613; 156/DIG. 64; 423/349; 427/86; 427/95
[58] Field of Search .................. 156/613, 614; 427/86, 427/95, 248; 423/348–350; 118/719, 48–49.1; 148/174, 175; 422/245, 246

[56] References Cited

U.S. PATENT DOCUMENTS

| | | | |
|---|---|---|---|
| 3,057,690 | 10/1962 | Reuschel et al. | 427/86 |
| 3,058,812 | 10/1962 | Chu et al. | 427/86 |
| 3,147,141 | 9/1964 | Ishizuka | 423/349 |
| 3,508,962 | 4/1970 | Manasevit et al. | 156/613 |
| 4,150,168 | 4/1979 | Yatsurugi et al. | 423/349 |
| 4,173,944 | 11/1979 | Koppl et al. | 427/86 |

*Primary Examiner*—Gregory N. Clements
*Attorney, Agent, or Firm*—Allison C. Collard; Thomas M. Galgano

[57] ABSTRACT

The invention relates to a method and device for making pure semiconductor material by thermal decomposition of compounds of the semiconductor material on suitable carrier elements. The quantity and quality of the obtained semiconductor material is increased in accordance with the invention by introducing the compounds to be decomposed into the reactor chamber in at least a partially liquid state through a nozzle having a plurality of discharge openings.

4 Claims, 2 Drawing Figures

METHOD FOR THE DEPOSITION OF PURE SEMICONDUCTOR MATERIAL

The present invention relates to a method for the deposition of pure semiconductor material, in particular, silicon, by thermal decomposition of a compound of the semiconductor material, on the surface of a heated carrier element, which carrier element is heated by applying an electrical current thereto, so as to heat the same to the decomposition temperature of the corresponding decomposable compound in a gas-tight, closed reactor. The invention also relates to a nozzle used in the inventive process for feeding the decomposable compound.

When making pure semiconductor material, for example, polycrystalline silicon from, e.g., trichlorosilane, the deposition speed substantially depends on the temperature, the reactor pressure and the amount of trichlorosilane which is processed. At a given pressure and at a given temperature, an increase of the deposition rate may only be obtained by increasing the quantity of the trichlorosilane which is being processed. With the usual trichlorosilane-hydrogen mixtures having a trichlorosilane proportion of 5 to 10 Vol.%, such an increase is no longer possible, since an increased quantity results in a correspondingly increased flow speed, as a result of which the dwell time of the decomposable compound for a quantitative deposition on the heated carrier element would be too short. On the other hand, substantially higher concentrations, for example, 50 Vol.% trichlorosilane in the mixture, result in problems during the gas feeding and for making the mixture itself.

Moreover, very expensive saturators are required, wherein the hydrogen charges itself with the corresponding quantity of the gaseous trichlorosilane. On the other hand, all gas feeding lines must be heated up to and into the reactor, so as to prevent the trichlorosilane from condensating out. A further problem is that with an increase in the quantity of the decomposable compound and an increase in the quantity of the semiconductor material to be deposited, the diameter of the polycrystalline silicon rods which are in the reactor, grows faster in the upper portion of the reactor than in the lower portion of the reactor. In addition, the surface characteristics of such polycrystalline rods is disadvantageously changed due to bubble or groove formations. In particular, when using such rods for making monocrystals in accordance with the zone-drawing method, extended operating times are required and increased grinding losses are experienced.

It is therefore an object of the present invention to make polycrystalline semiconductor material with a site-independent, uniform thickness and surface quality, by increasing the charge of the decomposable compound of the desired semiconductor material.

This object of the invention is obtained by a method which is characterized in that the corresponding decomposable compound is at least partially fed into the reactor in a liquid state.

Basically, in addition to the corresponding compound which forms the semiconductor material due to decomposition, hydrogen is introduced into the reactor vessel. When making silicon, in addition to the trichlorosilane, enough hydrogen is preferably introduced into the reactor, such that, after the evaporation of the trichlorosilane in the reactor, at least 40 Vol.% of hydrogen remains present in the reactor. In order to assure a uniform growth of the rods, the trichlorosilane quantity which is introduced into the reaction vessel during the deposition process, is continuously increased in the same quantity and relationship with respect to the hydrogen.

In accordance with a preferred embodiment of the invention, the decomposable compound of the semiconductor material to be deposited, (for example, trichlorosilane, when making silicon), is preheated in a heat exchanger outside of the reactor by means of the hot gases which discharge from the reactor. Thereby, a partial evaporation takes place and this partially evaporated trichlorosilane is fed into the reactor. For a better distribution of the still liquid trichlorosilane, the hydrogen is admixed therewith before being introduced into the reactor. The liquid trichlorosilane which is sprayed into the reactor is immediately evaporated by the high heat emission of the glowing silicon rods in the reactor.

In order to obtain silicon rods with a high uniform diameter, it is necessary to generate a uniform trichlorosilane concentration throughout the total reactor. This is achieved in accordance with the invention in that the decomposable semiconductor compound is introduced into the reactor in two or more partial streams.

Other objects and features of the present invention will become apparent from the following detailed description considered in connection with the accompanying drawings, which disclose several embodiments of the invention. It is to be understood, however, that the drawings are designed for the purpose of illustration only and not as a definition of the limits of the invention.

Figure 2:
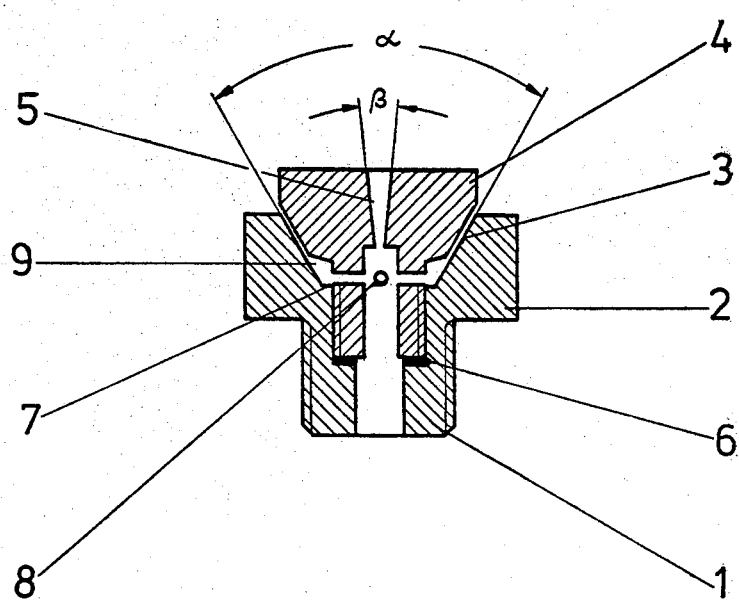

In the drawings, wherein similar reference characters denote similar elements throughout the several views:

FIG. 1 is a schematically-illustrated, cross-sectional view of a deposition reactor provided with a preheating mechanism, used in the process embodying the present invention and further showing a nozzle embodying the present invention installed therein, which is used for injecting a decomposable compound into the deposition reactor; and FIG. 2 is a schematically-illustrated cross-sectional view of the nozzle shown in FIG. 1.

Turning now in detail to the drawings, the deposition of the gas-liquid mixture which is introduced into the reactor is essentially carried out with a nozzle, as shown in FIG. 2. Suitable materials for the nozzle are, e.g., silver, silver-plated steel or refined steel. The nozzle essentially consists of a tubular element 1 having an upper portion 2, which is provided with a funnel-like recess 3, the opening angle $\alpha$ of which is about 30° to 120° and preferably 40° to 80°. An insert 4 is screwed into the tubular element 1. Insert 4 is provided with a central bore 5, having a diameter between 2 to 11 mm, and preferably, about 5 to 10 mm. Preferably, bore 5 of insert 4 is also upwardly flared and, if such is the case, defines an opening angle $\beta$ of about 8° to 15°.

The radial distance between upper portion 2 and the "inserted" insert 4 forms an annular slot, having a width of about 0.4 to 3 mm (preferably 0.7 to 1.2 mm). The width of this slot can be easily adjusted before mounting the insert 4, by inserting corresponding distance discs 6. Supply lines 7 and 8 are provided which run from the central bore of the nozzle into the annular slot. In the present case, they consist of four cylindrical supply lines, which are disposed horizontally in a radially, spaced-apart manner at a distance of 90° from each other, or four bores in insert 4, through which the gas-liquid mixture penetrates into a free space 9, which is provided for technical flow reasons, and then into the annular slot.

FIG. 1 illustrates the basic deposition device for carrying out the method of the invention; this deposition device generally corresponds to the one disclosed in German Patent Application P No. 28 54 707, with the exception of the nozzle and the preheating unit for the decomposable semiconductor compound. This deposition device is particularly well suited because the inventive method is carried out at a pressure in the reactor of about 1 to 16 bar and, preferably, about 4 to 8 bar.

This deposition device is composed of a silver-plated base plate 10 and a bell consisting of a steel inner hood 11, plated on the inside with silver and a covering outer hood 12 made of steel. In base plate 10, on which the bell is fastened by a gas-tight, flanged connection, hollow spaces are provided throughout its entire body, which are connected to a cooling water system by means of an inlet pipe 13 and an outlet pipe 14. The intermediary space defined between inner hood 11 and outer hood 12 is cooled during the deposition process by pumping cooling water therethrough, the water entering through pipe 15 and discharging through pipe 16.

Thin rods 17 which serve as deposition carriers and which are, for example, disposed in a U-shaped manner, are held at the two free ends by electrodes 18 and 19. In order to prevent deposition upon the electrodes themselves, hollow electrode holders or retainers 20 and 21 are provided, which are also cooled with cooling water. The cooling water flows into the cavities of the electrode holders 20 and 21 through the inlet pipes 22 and 23, and discharges through the outlet pipes 24 and 25, respectively. The electrodes are conductively coupled by electrical contacts 26 and 27 with a power source (not shown).

The liquid decomposable semiconductor compound, for example, trichlorosilane in the case of silicon deposition, is fed through a heat exchanger 29 by a feed line 28. Due to the hot exhaust gases which are discharged through the discharge pipe 30, which exits from the bottom plate of the reactor and through inlet 31 into heat exchanger 29, the trichlorosilane which flows through line 28 is not only heated but is also partially evaporated. The hydrogen which is pumped through line 32 is also heated before the exhaust gases discharge from the heat exchanger at outlet 33. The exhaust gases are then fed to a condensation-distilling device (not shown) for recovering non-converted trichlorosilane.

Before the liquid and partially evaporated trichlorosilane is introduced into the nozzle arrangement 34 (shown in detail in FIG. 1), the preheated hydrogen from feed line 32 is admixed therewith in inlet pipe 35 of bottom plate 10 of the reactor. A quartz window 36, which is also water cooled, permits one to observe the progress of the deposition process in the reactor. At the apex or tip of the bell, an opening 37 is provided which can be closed off by means of cooling pot 38, fastened by a flanged connection. This cooling pot 38 is open at its top and may be charged with a cooling agent, for example, water, by means of an inlet pipe 39. The water flows out through an overflow pipe 40. This cooling pot 38 and a disc 41, which serves as a seal, may be removed at the start of the deposition process, so as to lower a heating finger into the reactor for preheating the rods, for example.

Due to the invention nozzle, the trichlorosilane-hydrogen mixture is separated into two streams-namely, a conical-like, partial stream which is responsible for the required turbulence in the lower half of the reactor, and a vertical, partial stream, which has the same effect in the upper reactor half. On account of these turbulences throughout the total reactor, semiconductor pieces or rods are generated with smooth surfaces while, simultaneously, a supply of fresh trichlorosilane in both reactor halves achieves the desired improvement of uniform rod diameter. Due to the preheating of the liquid semiconductor compounds, for example, trichlorosilane in the case of silicon, by means of the reactor gases which discharge from the reactor, a considerable energy saving is obtained.

The inventive method permits deposition speeds of up to 4 mm/hr at a deposition temperature of 1100° C. and a reactor superpressure of 4 bar.

EXAMPLE

In a deposition device of the aforementioned type having a height of 260 cm and a diameter of 120 cm, wherein the intermediary space between the silver-plated inner hood and the outer steel hood has a radial width of about 2.5 cm, eight undoped thin rods with a specific resistance of about 5000 Ohm cm, a diameter of 0.7 cm and 200 cm in length, were coupled together in pairs in a U-shaped arrangement with a bridge made from the same material, and were retained in the associated water-cooled electrodes. Thereby, four thin pairs of rods were grouped symmetrically around the longitudinal axis of the reactor. Subsequently, a heating finger was introduced into the reactor, air was expelled from the reactor by the introduction of argon gas and the rods were heated to a red glow, i.e., to 600° C. in about one hour. About one-half hour before the end of this heating period, a voltage was applied to the thin rods. After reaching the ignition temperature of the rods, the heating finger was removed from the bell and the opening was closed by coupling the cooling pot by its flange connection. While the thin rods were heated by the electrodes to the required deposition temperature of about 1100° C., a trichlorosilane-hydrogen mixture was divided into two partial streams by the nozzle shown in FIG. 1, and fed into the reactor with a superpressure of 5 bar. The acute angle $\alpha$ of the funnel-like recess of the nozzle was 60° and the radial width of the annular slot was 0.8 mm. The diameter of the central bore in the nozzle insert was 5 mm and it flared upwardly at an acute angle $\beta$ of 11° to a diameter of 7 mm at its discharge end. The quantity used initially was 30 kg/hr of trichlorosilane, preheated in the heat exchanger with 20 m$^3$/hr hydrogen, also preheated in the heat exchanger. The quantity was uniformly increased toward the end of the deposition process to about 470 kg trichlorosilane/hr and 100 m$^3$ hydrogen/hr.

After 100 hours, the deposition was interrupted. The total weight of the deposited silicon was 472 kg and the rod diameter was 127 mm. The average deposition rate was 1.2 mm/hr.

While several embodiments of the present invention have been shown and described, it will be obvious to those persons of ordinary skill in the art, that many changes and modifications may be made thereunto, without departing from the spirit and scope of the invention.

What is claimed is:

1. In a method for the deposition of pure semiconductor materials, especially silicon, by thermal decomposition of a decomposable compound of the semiconductor material on the surface of a heated carrier element, wherein the carrier element is heated to the decomposition temperature of the decomposable compound in a gas-tight, closed and coolable reactor, the improvement comprising:

said decomposable compound being at least partially fed into said reactor in a liquid state.

2. The method according to claim 1, wherein said compound is trichlorosilane and wherein said trichlorosilane is fed into the reactor in admixture with hydrogen.

3. The method according to claim 2, additionally including the step of separately preheating said hydrogen and said decomposable compound of the semiconductor material to be deposited in a heat exchanger outside of the reactor by means of the hot gases which discharge from the reactor.

4. The method according to claim 1, 2 or 3, wherein said decomposable compound is initially fed into said reactor in two non-converging, separate, partial streams.

* * * * *